United States Patent
Sachan et al.

(10) Patent No.: US 7,259,979 B2
(45) Date of Patent: Aug. 21, 2007

(54) AREA EFFICIENT STACKED TCAM CELL FOR FULLY PARALLEL SEARCH

(75) Inventors: Rashmi Sachan, Karnataka (IN); Santhosh Narayanaswamy, Bangalore Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/367,650

(22) Filed: Mar. 3, 2006

(65) Prior Publication Data
US 2007/0097723 A1    May 3, 2007

(30) Foreign Application Priority Data
Oct. 28, 2005 (IN) .................. 1569/CHE/2005

(51) Int. Cl.
*G11C 15/04* (2006.01)
(52) U.S. Cl. ..................... 365/72; 365/49; 365/168
(58) Field of Classification Search ................ 365/168
See application file for complete search history.

(56) References Cited

U.S. PATENT DOCUMENTS 7,112,831 B2 *  9/2006  Kim et al. ................... 257/202
7,170,769 B1 *  1/2007  Sachan et al. ................ 365/49

* cited by examiner

*Primary Examiner*—Tan T. Nguyen
(74) *Attorney, Agent, or Firm*—Alan K. Stewart; W. James Brady; Frederick J. Telecky, Jr.

(57) ABSTRACT

An area efficient stacked TCAM cell for fully parallel search. The TCAM cell includes a top half circuit portion interconnected with a replicated bottom half circuit portion such that there is a shared match line between each of the half circuit portions. Each TCAM cell includes a pair of memory elements that is connected to a pair of associated compare circuits such that the interconnections between the memory elements and the compare circuits are substantially vertical in active MOS layers and substantially horizontal in metal layers. The memory elements and the compare circuits are connected such that they facilitate shorter interconnections and sharing of terminals at the boundary of adjacent cells. The resulting stacked TCAM cell provides shorter match lines, shared bit lines, and reduced silicon area to facilitate improved routing and performance.

24 Claims, 10 Drawing Sheets

AREA EFFICIENT STACKED TCAM CELL FOR FULLY PARALLEL SEARCH

TECHNICAL FIELD OF THE INVENTION

The present invention relates generally to digital integrated circuits, and more particularly relates to content addressable memories (CAMs).

BACKGROUND OF THE INVENTION

Content Addressable Memories (CAMs) are commonly used in cache systems, and other address translation systems, of high speed computing systems. They are also useful in high-speed network routers, and many other applications known in the art of computing. Ternary Content Addressable Memories (TCAMs) are ternary state CAM cells and are commonly used for parallel search of high performance computing systems.

A TCAM system is composed of TCAM blocks with arrays of TCAM cells. A TCAM system typically has a TCAM block array (M×N) that includes a plurality of rows (M) and a plurality of columns (N). Further, each row has a plurality of TCAM blocks, and each TCAM block has a plurality of TCAM cells. These arrays typically have vertically running bit lines and search lines for data read/write function and horizontal running word lines and match lines. All TCAM cells in a column share the same bit lines and search lines, whereas the word lines and match lines are shared by all cells in a row. Each TCAM cell includes a pair of memory elements and a corresponding pair of compare circuits.

The TCAM cells are characterized by circuitry capable of generating a match output for each row of TCAM blocks in the TCAM cell thereby indicating whether any location of the array contains a data pattern that matches a query input and the identity of that location. Each TCAM cell typically has the ability to store a unit of data, and the ability to compare that unit of data with a unit of query input and each TCAM block has the ability to generate a match output. In parallel data search, an input keyword is placed at the search bit lines after precharging the match lines to a power supply voltage Vdd. The data in each TCAM cell connected to a match line is compared with this data, and if there is a mismatch in any cell connected to a match line, the match line will discharge to ground through the compare circuit of that TCAM cell. A compare result indication of each TCAM block in a row is combined to produce a match signal for the row to indicate whether the row of TCAM cells contains a stored word matching a query input. The match signals from each row in the TCAM cell together constitute match output signals of the array; these signals may be encoded to generate the address of matched locations or used to select data from rows of additional memory.

Each TCAM cell in each column is typically connected to a common read/write bit line pair and search bit line pair. The common read/write bit line is used to write the data to a pair of memory cells, which can be part of a TCAM cell. Each memory cell is accessed using a word line which is decoded using an input address. The common read/write bit line is also used for reading the data from a memory cell. The differential developed across the read/write bit lines are sensed using a sense amplifier during a read cycle.

Further, each TCAM cell in each column is typically connected to a common query data line, also referred to as a common search bit line. The common search bit line enables simultaneous data searching in each CAM cell in a column from a query input. The common search data line can also be used as a write data line, when the CAM cell is based on a PMOS compare circuit.

The unit of data that is stored in a TCAM cell is ternary, having three possible states: logic one, logic zero, and don't care. To store these three states, two memory elements are needed. TCAM blocks of these TCAM cells produce a local match compare result if the query input is equal to the data stored in the CAM cells in the TCAM blocks, the query input contains a don't care state, or the data stored is a don't care data. The TCAM cells produce a mismatch result otherwise. The TCAM cells are particularly useful in address translation systems that allow variable sized allocation units.

A typical problem with TCAM cells is that they use extra transistors for search function, and therefore require large silicon area and consume more power. The resulting interconnections contribute to leakage capacitance that affects system performance. Many inventions in the field of TCAMs are aimed at solving these issues of area, power and performance. One conventional technique to reduce the silicon area and power consumption uses different NAND based compare transistors connected in series, to reduce the TCAM cell size and power consumption. However, this technique fails to perform well at lower voltages, because the voltage at the gate of the TCAM cell is equal to VDD (supply voltage)–Vt (threshold voltage). Further, this approach limits the performance.

Another conventional technique uses same bit lines for read/write as well as search to reduce the number of total bit lines per TCAM cell in an effort to reduce the silicon area. This approach requires using PMOS transistors in the compare circuit, which generally reduces the speed of operation during a compare operation. In addition, this approach requires evaluating the search bit lines during write operation, which results in the dissipation of a large amount of power. Yet another conventional technique to minimize area uses DRAM based memory circuitry. But this approach is not suitable for speed sensitive applications such as cache memories since the dynamic refreshing required by DRAMs slows down the system operation.

Another significant problem of TCAMs is capacitance effects due to large number of match lines and bit lines, and the associated interconnect capacitances. Parallel searching requires high power and for large arrays, bit line capacitances are significant. Some approaches to circumvent this problem have been to reduce the number of bit lines and number of interconnections and the length of interconnections. Shorter lines reduce the line capacitances and thereby reduce the power dissipation.

SUMMARY OF THE INVENTION

According to an aspect of the subject matter, there is provided a TCAM cell in which a pair of memory elements is connected to an associated pair of compare circuits that are interconnected so as to be disposed substantially vertically in active NMOS and active PMOS layers. Further the circuits are interconnected using substantially horizontal interconnections in selective poly and metal layers. The memory elements further provide shared bit lines between adjacent TCAM cells for storing a data bit and, the compare circuits are connected to a search bit for comparing the stored data to a compare data bit via a shared match line. Further, the transistors are disposed such that the TCAM cell is vertically disposed in a stacked vertical arrangement with the top half circuit portion stacked vertically above a bottom half circuit portion, so as to provide a shared, halved match line, and shared bit lines between half TCAM cells. The TCAM cell further provides sharing of terminals at the boundaries of two half cells as well as between adjacent TCAM cells. The resulting shorter match lines, reduced capacitances, and shorter interconnections provide efficient routing and improved system performance.

BRIEF DESCRIPTION OF THE DRAWINGS

FIG. 6 is a layout diagram of the TCAM cell showing the active, poly, and contact layers.

FIG. 7 is a layout diagram of the TCAM cell similar to the one as shown in FIG. 6, but in addition to the active, poly and contact layers, there is depicted the metal 1 layer.

FIG. 8 is a layout diagram of the TCAM cell similar to the one as shown in FIG. 7, but in addition to the active, poly, contact, and metal 1 layer, there is depicted the via 1 and the metal 2 layer.

FIG. 9 is a layout diagram of the TCAM cell similar to the one as shown in FIG. 8, but in addition to the active, poly, contact, metal 1 layer, via 1, and metal 2 layer, there is depicted the via 2 and metal 3 layer.

DETAILED DESCRIPTION OF THE INVENTION

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
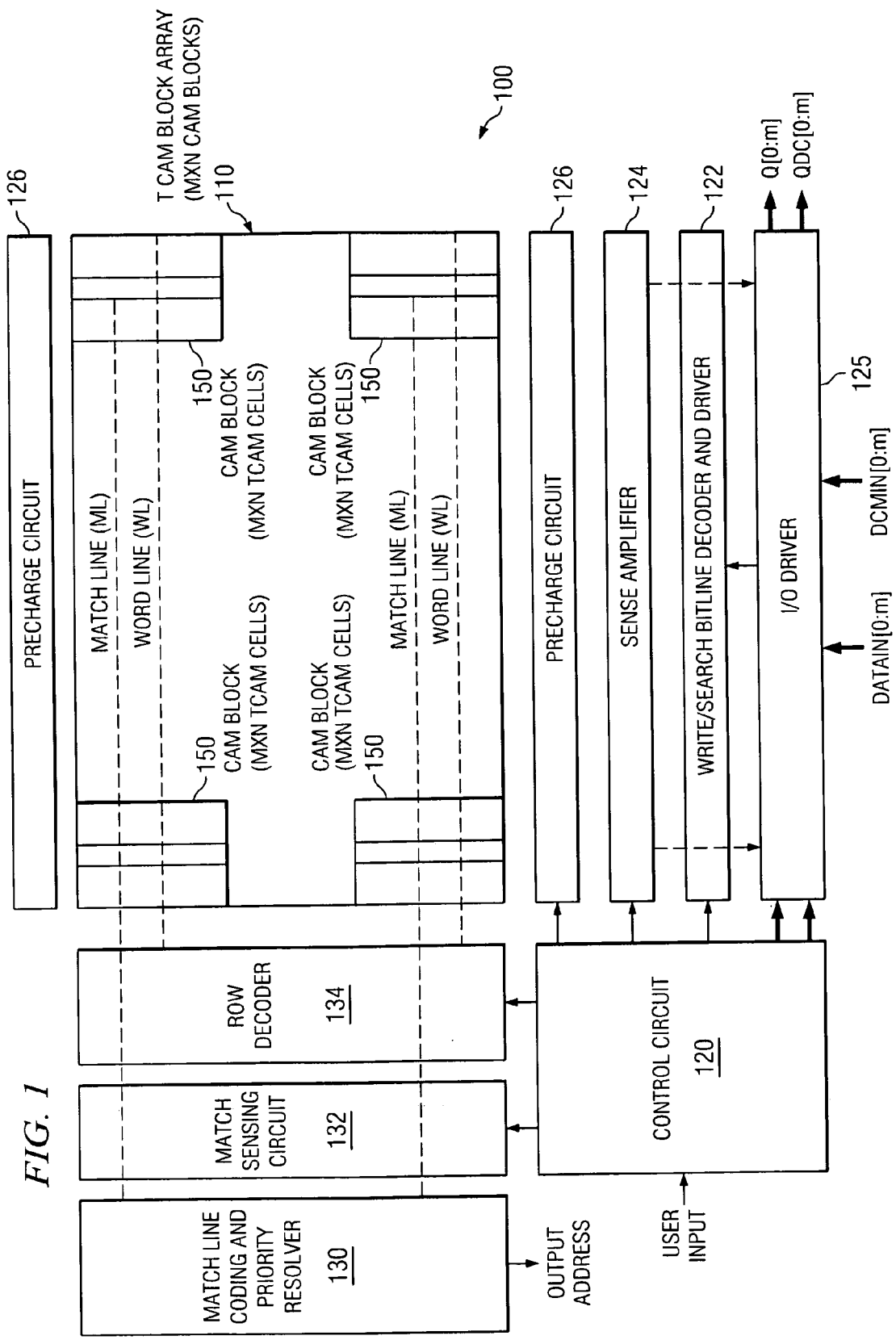
FIG. 1 is a block diagram of a TCAM system architecture according to an embodiment of the present invention.

Referring now to FIG. 1, there is illustrated an embodiment of a TCAM system 100 according to the present invention. The TCAM system 100 includes a TCAM block array 110, a control circuit 120, write/search bitline decoder and driver circuits 122, sense amplifiers 124, read/write bitline and search bitline precharge circuits 126 and input/output (I/O) drivers 125. As shown in FIG. 1, the TCAM system 100 further includes a match line encoding and priority resolver 130, a match sensing circuit 132, and a row decoder 134.

Figure 4:
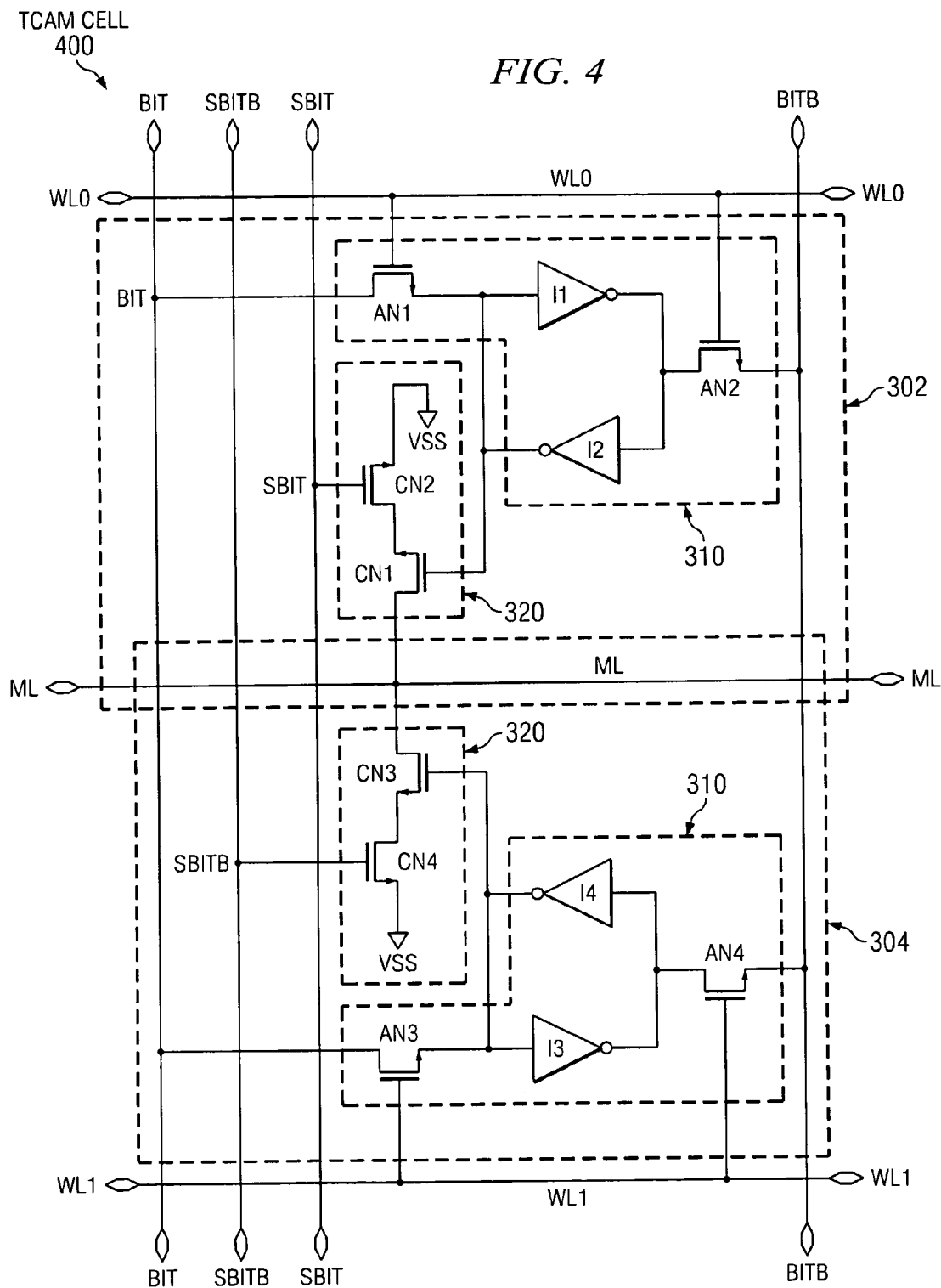
FIG. 4 is a schematic diagram of a stacked TCAM cell according to an embodiment of the present invention as shown in FIGS. 1 and 2.

Further as shown in FIG. 1, the TCAM block array 110 has multiple TCAM blocks 150 which are organized into at least one rectangular array which has a plurality of rows, and each row has a plurality of TCAM blocks, and each TCAM block 150 has a plurality of TCAM cells. In some embodiments, the TCAM block array 110 is arranged to include (M×N) TCAM blocks which has M number of rows and N number of columns. As shown in FIG. 1, each of the plurality of TCAM cells has an associated match line (ML) and a word line (WL). This word line is internally split into two word lines WL0 and WL1 respectively for the bottom and top half of each TCAM cell (as shown in FIG. 4). A control circuit 120 receives user input and is in communication with the precharge circuit 126, sense amplifier 124, write/search bitline decoder and driver 122, and I/O driver 125. An I/O driver 125 is in communication with the control circuit 120 and the write/search bitline decoder and driver 122. The I/O driver 125 receives the external input signals DATAIN [0:m] and DCMIN [0:m] and sends output signals Q [0:m] and QDC [0:m] where m is the number of data bits. The associated read/write bit lines and read/write bit complement lines BIT and BITB (shown in FIG. 2) are coupled to the one or more precharge circuits 126, the sense amplifier 124, and the write/search bit line decoder and driver circuit 122 (shown in FIG. 1). Further, the I/O driver 125 receives the external input signals DATAIN and DCMIN and output signals Q, and QDC (shown in FIG. 1). The DATAIN is a user sent input data sent to compare stored data. The DCMIN is a user data compare input. For example, if DCM is high then the input value is considered as a don't care input and value at DATAIN is not compared. The Q and QDC outputs are the read output signals from the I/O driver 125.

Figure 2:
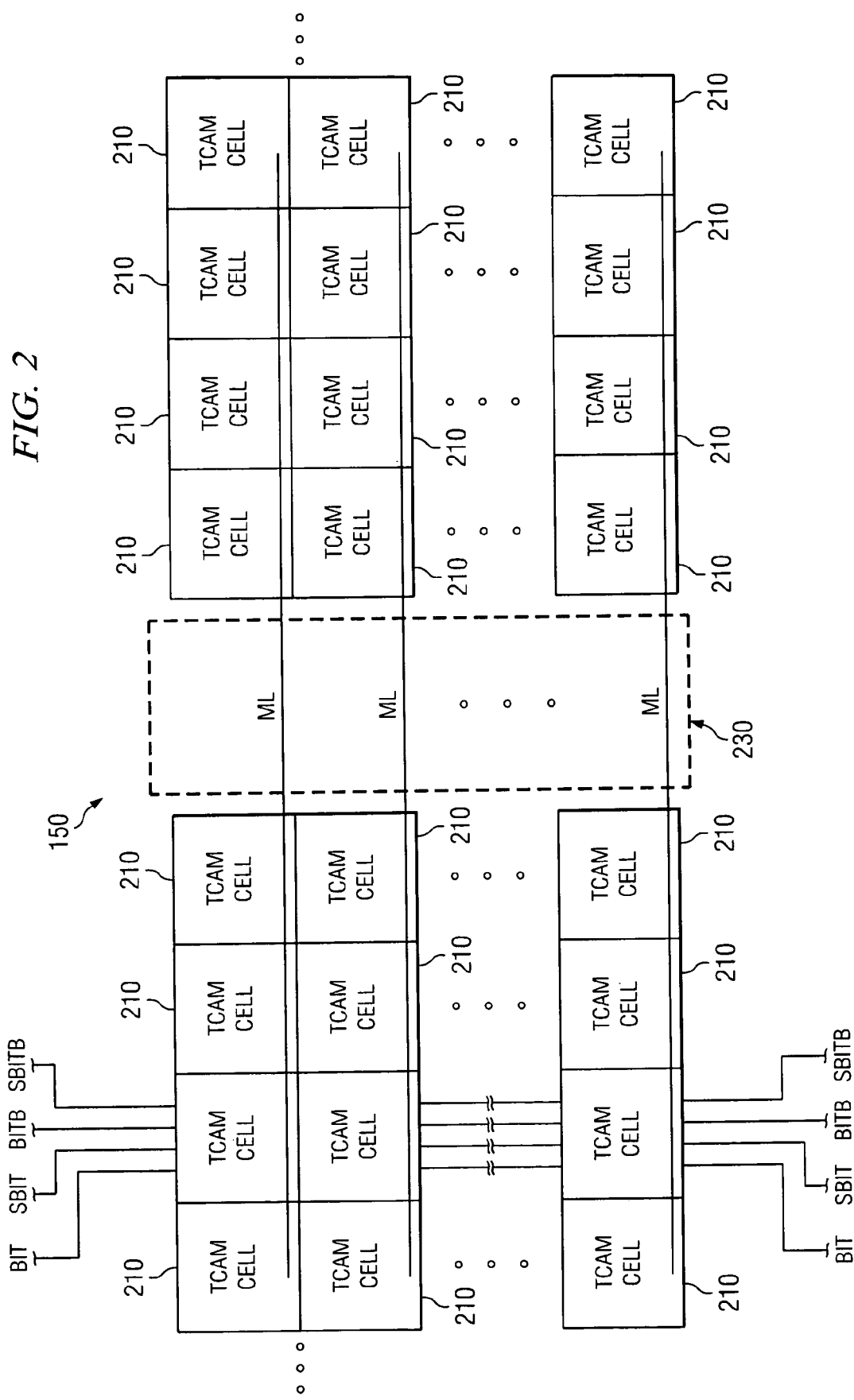
FIG. 2 is a block diagram of a TCAM block and its associated conversion circuitry according to an embodiment of the present invention, as shown in FIG. 1.

Referring now to FIG. 2, there is illustrated an embodiment of a TCAM block 150 (as shown in FIG. 1). As shown in FIG. 2, each TCAM block 150 includes a plurality of TCAM cells which are arranged into a rectangular array such that each TCAM cell 210 is associated with a row and a column in the CAM block 150. In some embodiments, each TCAM block 150 includes (M×N) TCAM cells arranged in a rectangular array of M number of rows and N number of columns. Each TCAM cell in the TCAM block 150 includes a read/write bit line BIT and its associated read/write bit complement line BITB, and, a search bit line SBIT and its associated search bit complement line SBITB, each of which is connected to each of the associated plurality of TCAM cells 210. FIG. 2 illustrates an example TCAM cell showing bit lines running vertically through each single TCAM cell.

Further as shown in FIG. 2, the plurality of TCAM cells 210 in each TCAM block 150 are connected to an associated match line ML. In some embodiments, each of the multiple TCAM blocks 150 includes a local to global conversion circuit 230, which converts the local match signal to a global match signal associated with each row of TCAM cells. In these embodiments, the global match signals are sensed using a match sensing circuit 132 (shown in FIG. 1). In these embodiments, each of the plurality of TCAM cells 210 includes a pair of memory elements for storing a data bit and a pair of associated compare circuits for comparing the stored data bit with a received compare data bit.

Figure 3:
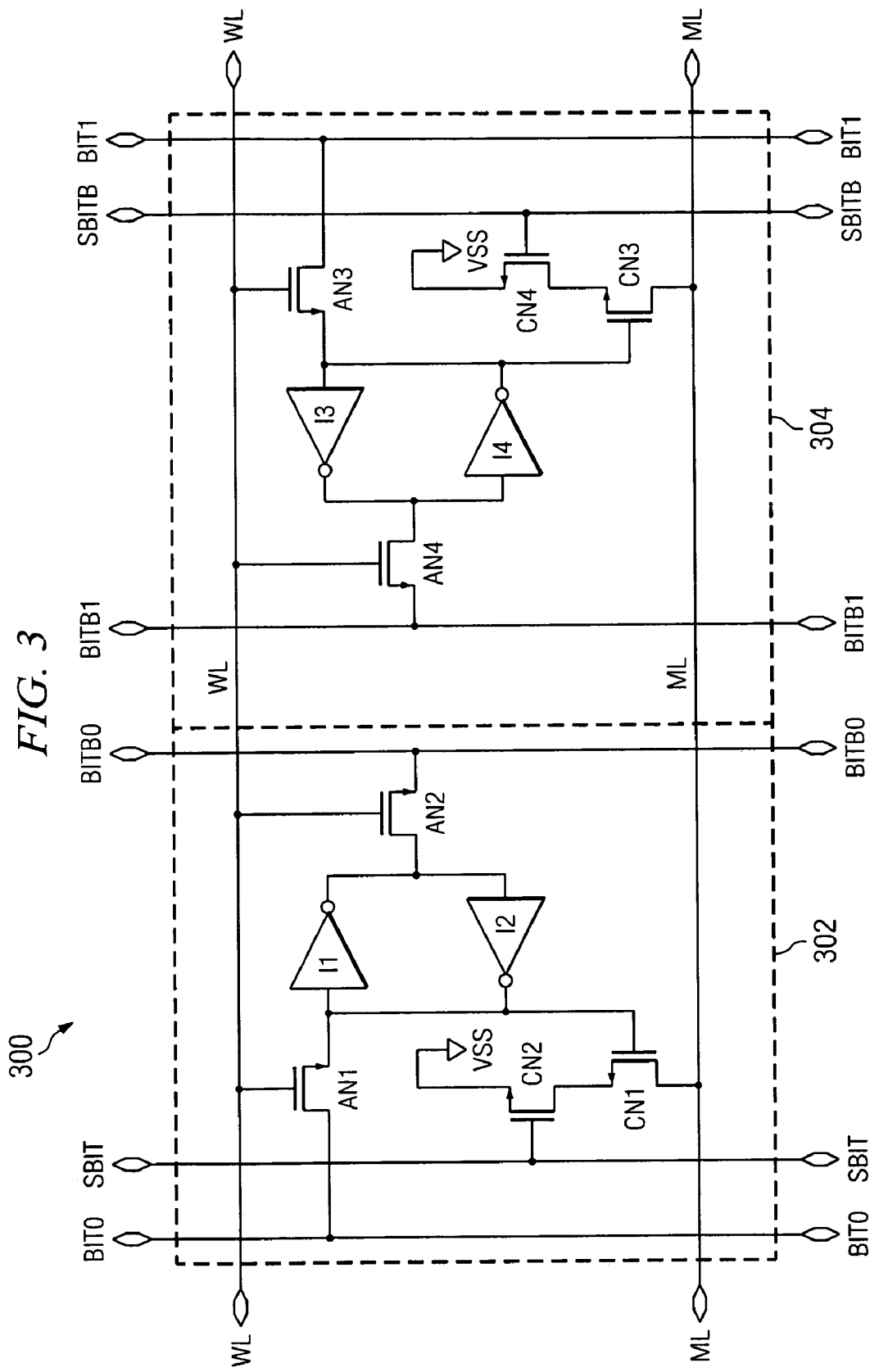
FIG. 3 is a schematic diagram showing a conventional TCAM memory cell where two memory elements and their search related circuitry are placed side by side.

Referring now to FIG. 3, there is illustrated a circuit diagram of a conventional TCAM cell. As shown in FIG. 3, the TCAM cell 300 includes a left circuit portion 302, and a right circuit portion 304 interconnected to each other.

Each circuit portion includes a pair of memory elements and their associated NMOS based pair of compare circuits. Each of the memory elements in the left circuit portion includes a pair of back to back inverters I1 and I2, and a pair of access transistors AN1 and AN2. The left compare circuit includes a pair of NMOS transistors CN1 and CN2. Similarly, the right circuit portion includes inverters I3, and I4 and their associated access transistors AN3 and AN4, and their associated compare transistors CN3 and CN4. Match line ML runs horizontally through both the left and right circuit portions 302 and 304 respectively of the TCAM cell 300. The left circuit portion 302 includes a pair of read/write bit line and an associated read/write complement bit line BIT0, BITB0 respectively, and a search bit line SBIT. The right circuit portion includes a pair of read/write bit line and an associated read/write complement bit line BIT1, BITB1 respectively and a search bit complement line SBITB.

Referring now to FIG. 4, there is illustrated a circuit diagram of a TCAM cell 400 used in the TCAM block 150 (shown in FIG. 1) of the TCAM block array 110 (shown in FIG. 1). As can be seen, the TCAM cell 400 includes two half circuit portions stacked vertically such that there is a top half circuit portion 302, and a bottom half circuit portion 304. In the embodiments shown, the TCAM cell includes two memory elements, such as SRAM cells that can store two data bits to provide a ternary 3-state CAM cell (logic state zero, logic state one, and don't care).

Although the invention as illustrated in FIG. 4 describes a ternary CAM cell supporting two bits and three logic states, it can be envisioned that the invention can be practiced using a binary CAM cell supporting a single bit, and two logic states (zero and one).

As shown in FIG. 4, the TCAM cell 400 uses a 16 transistor arrangement with 12 NMOS type and 4 PMOS type transistors. The 16 transistor TCAM cell 400 has two half circuit portions, with 8 transistors in each of the top half circuit portion 302, and the bottom half circuit portion 304. The top half circuit portion 302 is interconnected with the bottom circuit portion 304 such that a match line ML is shared between the two half circuit portions.

Associated with each half circuit portion is a pair of memory element 310 and a compare circuit 320. The memory element 310 uses a 6 transistor SRAM arrangement having a pair of back-to-back inverters and a pair of access transistors. The first and second back-to-back inverters I1 and I2 are associated with the top half circuit portion 302, and the first and second back-to-back inverters I3 and I4 are associated with the bottom half circuit portion 304. A pair of first and second access NMOS transistors is associated with each of the back-to-back inverters. Inverters I1 and I2 are accessed through first and second access NMOS transistors AN1 and AN2 in the top half circuit portion 302, and inverters I3 and I4 are accessed through first and second access NMOS transistors AN3 and AN4 in the bottom half circuit portion 304. The gate of each of the access transistors is connected to a horizontal running word line which is shared with an adjacent TCAM cell 400 in a horizontal direction. It must be noted that the word line associated with first and second access NMOS transistors AN1 and AN2 of the top half circuit portion 302 is connected to a first word line WL0, whereas the word line associated with first and second NMOS access transistors AN3 and AN4 of the bottom half circuit portion 304 is connected to a second word line WL1. The word lines WL0 and WL1 are shared by the respective word lines in all TCAM cells in a row. In addition, vertically running read/write bit lines BIT and BITB and search bit lines SBIT and SBITB are available.

Each transistor has 3 terminal connections, a gate, source and drain. Typically for NMOS transistors the lower voltage terminal is the source and the higher voltage terminal is the drain. Although the source, and drain terminals can be interchanged, a NMOS type transistor typically uses the ground terminal VSS as the source and a PMOS type transistor uses the power supply VDD as the source.

In the embodiment shown in FIG. 4, first and second back-to-back inverters I1 and I2 can be accessed via gates of the pair of first and second access NMOS transistors AN1 and AN3 and word line WL0. Further, the drain terminal of each of the first access NMOS transistors AN1 and AN3 of the top half circuit portion 302 is connected to a shared read/write bit line BIT, and the drain terminal of each of the second access NMOS transistors of the top and half bottom circuit portions is connected to a read/write bit complement line BITB. Also, first and second back-to-back inverters I1 and I2 can be accessed via the associated read/write bit and read/write bit complement lines. It can be seen that the bit lines are positioned such that in the stacked TCAM arrangement, only one read/write bit line pair is available for both half circuit portions, whereas in a conventional TCAM cell 2 pairs of bit lines are provided. The effect of this is removal of one bit line pair, thereby reducing the number of available bit lines by half, and their associated line capacitances.

One of the main differences between a conventional TCAM cell (as shown in FIG. 3) and a stacked TCAM cell (as shown in FIG. 4) is the sharing of read/write bit lines BIT and BITB between each of the half circuit portions.

As shown in FIG. 4, a pair of read/write bit line and read/write bit complement lines BIT and BITB (shown in FIG. 2) are associated with each of the TCAM cell 400. Also, associated with each TCAM cell are 2 memory locations. During a read cycle, the I/O driver reads a stored data bit in each TCAM cell via the associated read/write bit line. During a write cycle, the I/O driver writes a data bit to each TCAM cell 400 via the associated read/write bit complement line. Further, the I/O driver 125 receives the external input signals DATAIN and DCMIN and outputs signals Q, and QDC. The DATAIN is a user sent input data sent to compare stored data. The DCMIN is a user data compare input. For example, if DCM is high then the input value is considered as a don't care input and value at DATAIN is not compared. Signal Q is a data output signal and signal QDC is a data compare output signal.

The drawback however, with sharing a single read/write bit line pair for both memory locations of a TCAM cell is that it requires two cycles for each read/write operation. This is because the same bit line pair is used for reading and writing into two memory locations and only half data is written into memory in one cycle. The search operation, however, requires only one cycle per operation.

This reduced write and read throughput can be restored by using burst write and read mechanism where the input write data bus is divided into two pieces and written in two cycles internally. This requires muxed TCAM architecture where the mux factor is same as number of burst cycles.

Further, as shown in FIG. 4, each of the pair of compare circuits 320 includes serially connected first and second compare NMOS transistors. The top half circuit portion 302 uses compare NMOS transistors CN1 and CN2 for implementing the search bit SBIT function, and the bottom half circuit portion uses compare transistors CN3 and CN4 respectively for implementing the search bit complement SBITB function. The drain terminals of the first compare NMOS transistors CN1 and CN3 are connected to the shared match line ML. A common gate terminal 450 (FIG. 5A) is provided that connects the gate of the first compare NMOS transistor CN1, to the gates of first load PMOS transistor LP1, and its associated first driver NMOS transistor DN1 (of inverter I1), all three associated with the top half circuit portion 302. Similarly, a common gate terminal 450 is provided that connects the gate of the first compare NMOS transistor CN3, to the gates of the first load PMOS transistor LP3 and its associated first driver NMOS transistor DN3 (of inverter I2), all three associated with the bottom half circuit portion 304 (FIG. 5B). The top and bottom half circuit portions are oriented such that the bottom half circuit portion 304 is almost a mirror replica of the top half circuit portion 302 and provides for a match line ML that is shared between the half cells at the stacked centerline dividing boundary of the full TCAM cell 400. In effect, the stacked orientation of the top and bottom half circuit portions 302 and 304 provides a shared match line ML between the half cells such that the length of the match line ML is now reduced by about a half The number of TCAM cells connected to each of the match line ML is decided based on the performance and leakage effect on evaluated lines. Thus, a fully parallel search is enabled by this design. The above technique takes into account the tradeoff of the transistor sizes used in the TCAM cell to achieve a higher performance and a reduced silicon area. In addition, the compare circuit transistors (controlled by the search bit line and memory cell node) are ordered such that charge sharing between match line and the intermediate node between the series connected compare circuit transistors, does not happen on match lines that do not evaluate a mismatch (the precharged state is retained on the match line). In case of a mismatch, the match line ML will be pulled low.

The capacitance associated with the match lines is high. Therefore, reducing the length of the match line reduces the active capacitance and therefore the power. It must be noticed that the effect of stacking the top and bottom half circuit portions is to shorten the word line and match line length by half, but in effect the bit line length increases to about one and a half times. The increase in bit line length is less because of match line contact sharing between the top and bottom half circuit portions. Further, stacking also causes a reduction in the height of the TCAM cell to about less than two times.

Figure 5A:
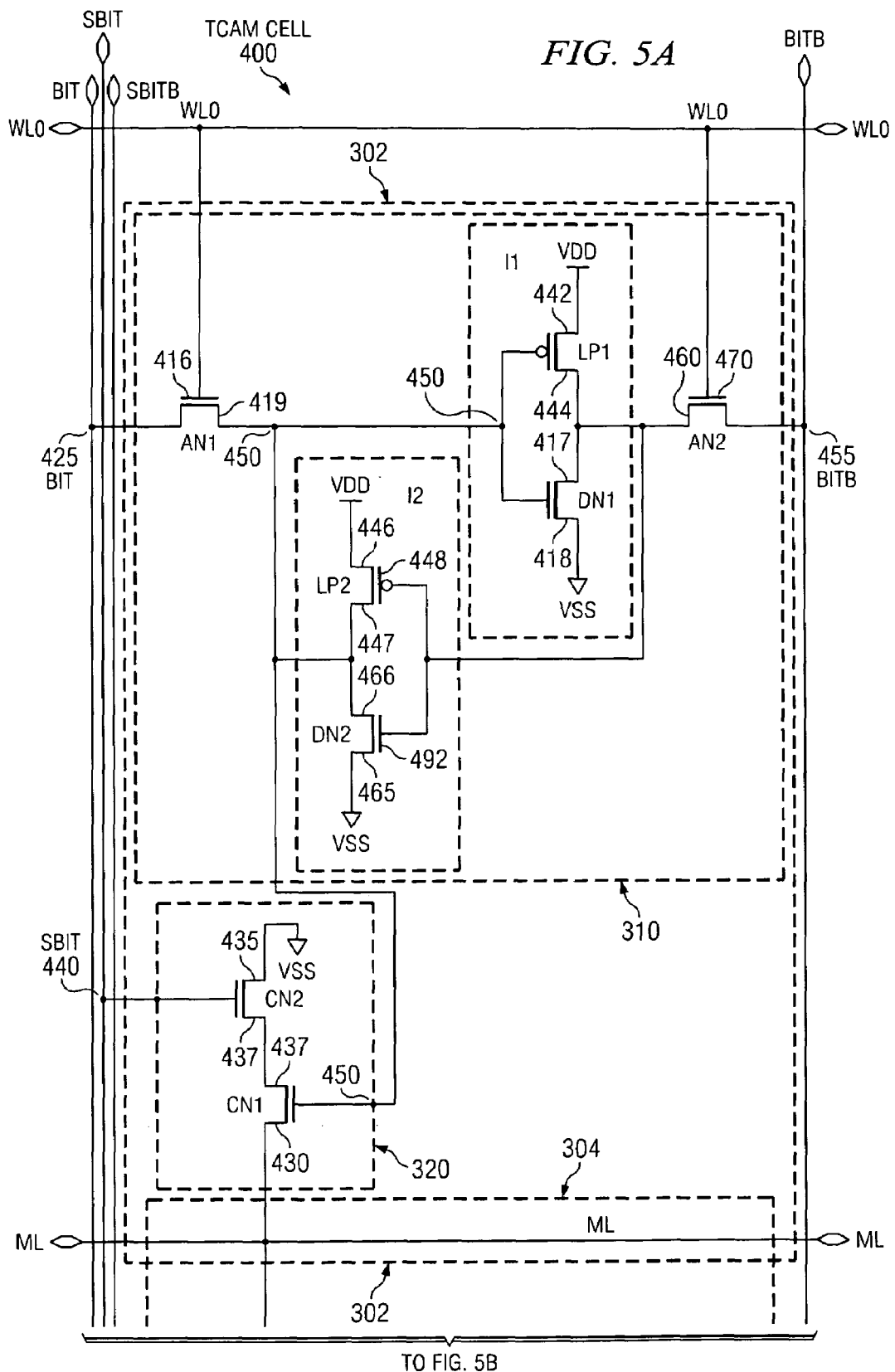
FIGS. 5A and 5B is a schematic diagram of a stacked TCAM cell showing the interconnectivity of the top and bottom half circuit portions according to an embodiment of the present invention as shown in FIG. 4.
Figure 5B:
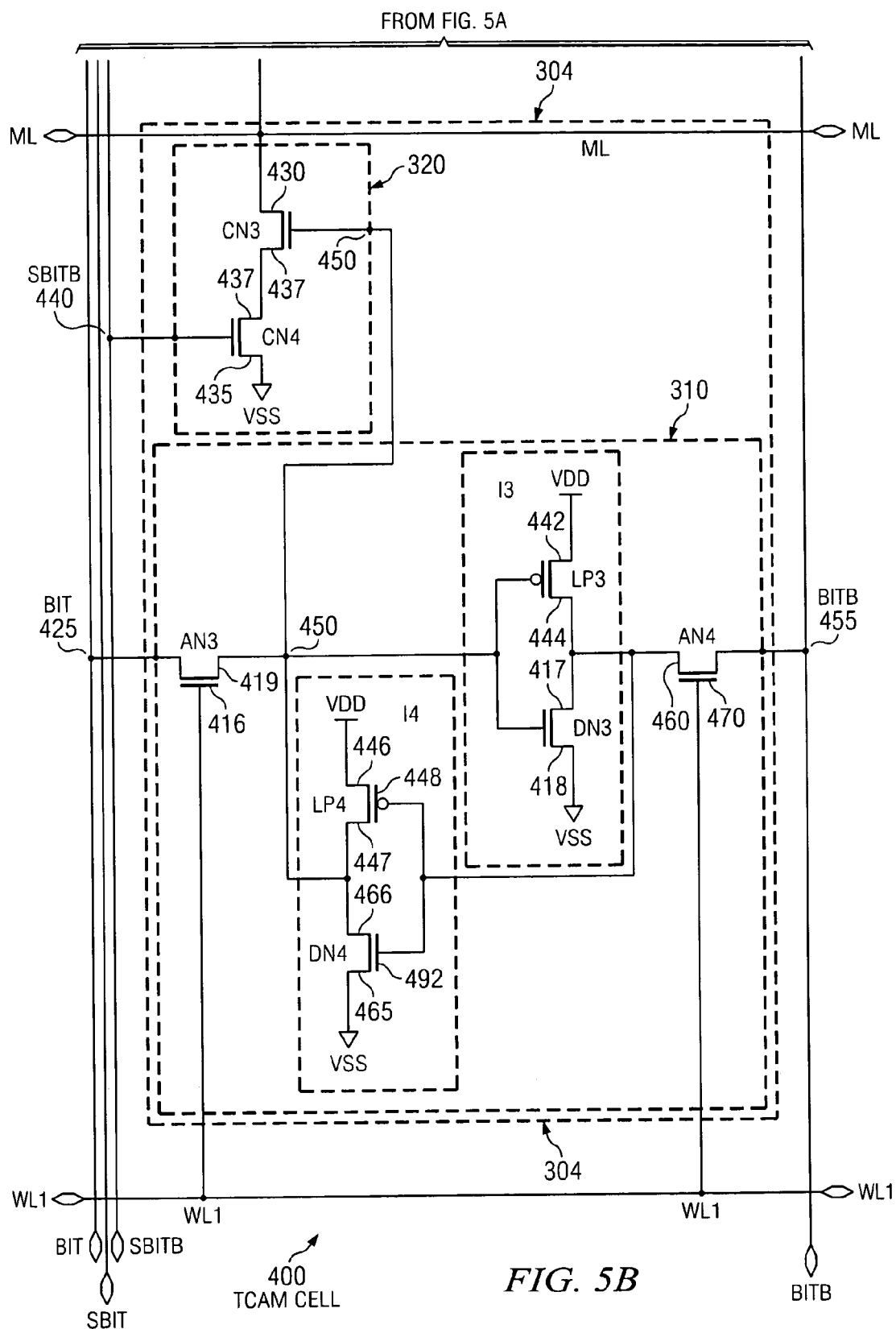

Referring now to FIGS. 5A and 5B, there is illustrated a detailed view of the circuit schematic of the TCAM cell 400 (as shown in FIG. 4) showing the terminal connections of each of the 16 transistors. Although shown separately, FIGS. 5A and 5B viewed together provide the interconnectivity of the 16 transistors in a full TCAM cell 400. FIG. 5A shows the interconnectivity of the top half circuit portion 302, and FIG. 5B shows the interconnectivity of the bottom half circuit portion 304, of the TCAM cell 400. FIGS. 5A and 5B show further, the back-to-back inverter circuits I1, I2, I3, I4 in detail and their interconnectivity to their associated access and compare transistor pairs. FIGS. 4, 5A and 5B viewed together provide all the interconnectivity needed to understand the cross coupled connections of the back-to-back inverters. Each half circuit portion 302 and 304 includes a memory element 310, and its associated compare circuit 320. Associated with each memory element 310, is a pair of back-to-back inverters and a pair of access transistors. First and second back-to-back inverters I1, I2 are associated with the top half circuit portion 302, and first and second back-to-back inverters I3, I4 are associated with the bottom half circuit portion. As can be seen, first and second NMOS access transistors AN1, AN2 are associated with the top half circuit portion 302, and first and second NMOS access transistors AN3, AN4 are associated with the bottom half circuit portion 304. The access transistors provide the word lines and the bit lines. A pair of compare transistors CN1, CN2 is associated with the top half circuit portion 302, and CN3, CN4 are associated with the bottom half circuit portion 304, for providing the match line, search bit lines, and the compare function. Further, each inverter is formed by a pair of load PMOS and driver NMOS transistors which are cross coupled to form each of the back-to-back inverters. Therefore, associated with each back-to-back inverter I1, I2, I3 and I4 is a load/driver pair of transistors LP1/DN1, LP2/DN2, LP3/DN3, and LP4/DN4 respectively. The inverters I1, I2 provide a cross-coupled feedback inverter to form a latch for storing data in the top half circuit portion 302, whereas I3, I4 provide a cross-coupled feedback inverter to form latch for storing data in the bottom half circuit portion 304.

As shown in FIGS. 5A and 5B, the drain terminals 425 of access transistors AN1 of the top half circuit portion 302 and AN3 of the bottom half circuit portion 304 respectively are connected to a shared read/write bit line BIT and, the drain terminals 455 of access transistors AN2 of the top half circuit portion 302 and AN4 of the bottom half circuit portion 304 respectively, are connected to a shared read/write bit complement line BITB. The bit lines BIT and BITB run vertically from top to bottom and are shared by each half of the TCAM cell as well as with each vertically adjacent TCAM cells. Similarly, vertical running search bit line SBIT is connected to the gate terminal 440 of the compare transistor CN2, while search bit complement line SBITB is connected to the gate terminal 440 of compare transistor CN4. Search bit lines SBIT, and SBITB run vertically and are shared with vertically adjacent TCAM cells.

The gate terminals 416, 470 of access transistors AN1 and AN3 of the top half circuit portion 302 are connected to a first word line WL0, whereas the gate terminals 416, 470 of access transistors AN2 and AN4 of the bottom half circuit portion 304 are connected to a second word line WL1. Horizontal word lines WL0 and WL1 are oriented at the periphery of the TCAM cells such that they run across each horizontally adjacent TCAM cell.

As shown in FIG. 5A, the source terminal 419 of access transistor AN1 is connected to the input of inverter I1 and output of inverter I2 and source terminal 419 of access transistor of AN3 is connected to the input of inverter I3 and the output of inverter I4. Similarly, source terminal 460 of access transistors AN2 is connected to input of inverter I2 and output of inverter I1 and source terminal 460 of AN4 is connected to input of inverter I4 and output of inverter I2.

As can be seen, the top half circuit portion 302, of the TCAM cell 400, includes serially connected first and second compare transistors CN1 and CN2. Likewise, the bottom half compare transistors are serially connected CN3 and CN4. The source terminal 430 of CN1 and CN3 of the top and bottom half circuit portions are connected to the match line ML which is at the stacked centerline boundary of the two half cells. In a conventional TCAM cell there is provided a single long match line connecting the left and right circuit portions (as in FIG. 3). The TCAM cell 400 shown in FIG. 4 provides for a match line ML where the length is reduced by half and the transistor orientation is such that the match line is shared between the two half portions of the TCAM cell.

Furthermore, gate terminal 450 of CN1 and CN3 is also connected to drain 466 of second driver NMOS transistor DN2 and to the drain 447 of the second load PMOS transistor LP2. The gate terminal 450 of CN1 and CN3 is connected to the common gate of load/driver transistors LP1, DN1 of inverter I1 of top half circuit portion 302. The gate terminal 450 of CN3 is connected to the common gate of load/driver transistors LP3, DN3 of inverter I2 of bottom half circuit portion 304. Further, each of the source terminals 419 of access transistors AN1 (as shown in FIG. 5A) and AN3 (as shown in FIG. 5B) is connected to each of the respective common gate connections 450 of each of the associated compare transistors 372 in each of the circuit portions of FIGS. 5A and 5B.

The gate terminal 440 of compare transistor CN2 of the top half circuit portion 302 (shown in FIG. 5A) is connected to search bit line SBIT whereas the gate terminal 440 of compare transistor CN4 of the bottom half circuit portion 304 (shown in FIG. 5B) is connected to the search bit complement line SBITB.

Figure 6:
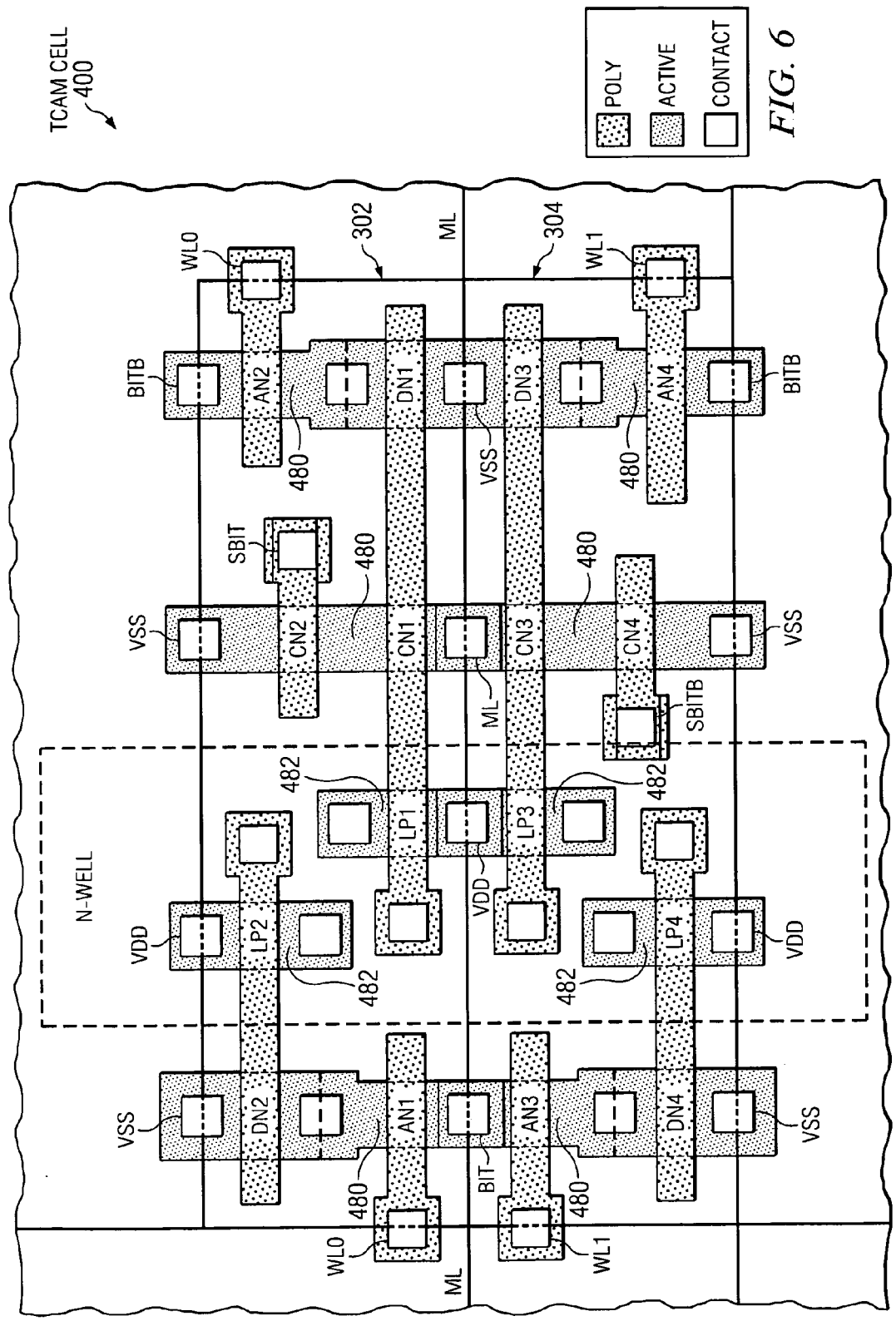
FIGS. 6-9 represent a group of sequential layout diagrams of a TCAM cell illustrating the various active, poly, and metal layers and their selective inter-connectivity in a full TCAM cell according to an embodiment of the present invention, as shown in FIGS. 4, 5A and 5B.
Figure 7:
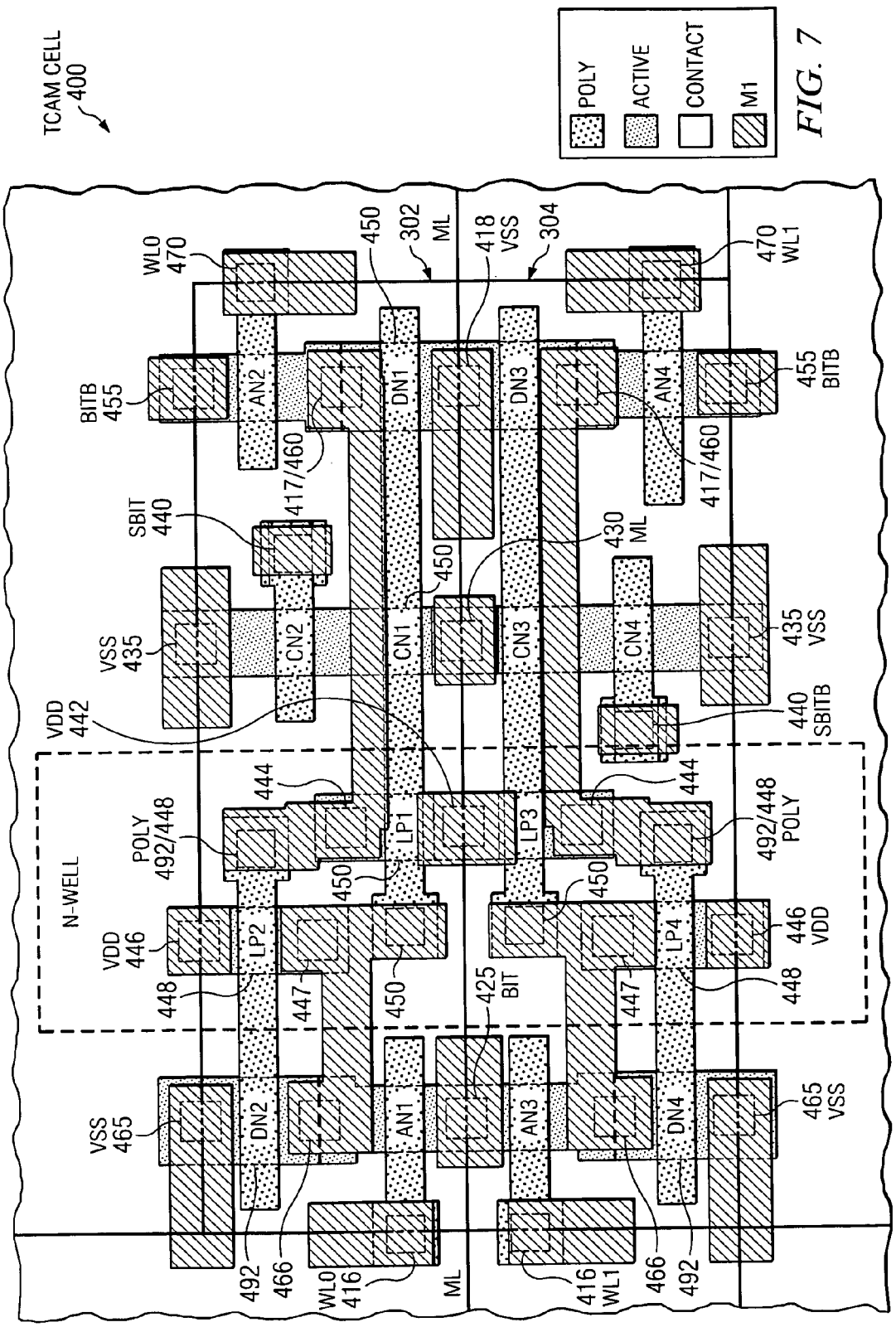

Referring now to the group of FIGS. 6 to 9, there is illustrated several layout figures of a full stacked TCAM cell 400 as shown in FIGS. 4, 5A and 5B, showing sequential addition of different active, poly, and metal layers. First, the active areas, poly, transistor names and their placements, are illustrated in FIG. 6. In addition to the active areas, poly, and transistor names, the individual terminal connections of each transistor are shown in FIG. 7. It must be noted that the transistor names and terminal connections and interconnectivity as shown in FIGS. 6 and 7 are applicable to each of the layout figures of FIGS. 6-9. The layout diagrams illustrate an embodiment of an interconnectivity of the top half circuit portion 302, and the bottom half circuit portion 304, each of which includes a pair of memory element 310 and its associated compare circuit 320, a pair of read/write bit line BIT and its associated read/write bit complement line BITB and, a pair of search bit line SBIT, and its associated complement SBITB (as shown in FIG. 4). Horizontal running word lines WL0 and WL1 and match lines ML are shown, which are shared with the adjacent TCAM cells. In addition, each of the layout figures FIGS. 6 to 9 depict the above mentioned circuit elements located in an active NMOS layer 480, an active PMOS layer 482, and the contacts which are used for interconnectivity of transistor terminals. In addition, FIG. 6 shows gate terminals in a poly layer (POLY) of the TCAM cell 400. Further, horizontal running metal lines and vertical running metal lines are shown that are used selectively to connect various transistors and signals.

It can be seen that the bottom half circuit portion 304 is almost a mirror replica and contains similar circuitry and interconnectivity as in the top half circuit portion 302. Furthermore, the inter-connectivity of the top and bottom circuit portions of the TCAM cell 400 extends to each TCAM cell in the TCAM block 150 (shown in FIG. 2).

Referring now to FIG. 6, there is illustrated a layout of a full TCAM cell 400 showing active, poly and contacts associated with the 16 transistors. The poly layer (POLY) is used for the gates of the transistors. It can be seen that the names of the transistors are marked on the POLY corresponding to the gate of the associated transistors. Access transistors AN1, AN2, AN3 and AN4 are formed in active NMOS layer 480. Driver transistors DN1, DN2, DN3, and DN4 are similarly formed in active NMOS layer 480. Load transistors LP1, LP2, LP3, and LP4 are formed in active PMOS layer 482 and are shown as sitting in an N-well substrate. Compare transistors CN1, CN2, CN3 and CN4 are formed in active NMOS layer 480. The source and drain regions of the transistors are shown as contacts. For clarity, only transistor names are marked on FIG. 6. The terminal connections of each individual transistor will be shown in FIG. 7.

As can be seen from FIG. 6, match line ML is the horizontal middle line that bifurcates the TCAM cell into 2 halves. The portion above the ML is the top half circuit portion 302 and the portion below the match line is the bottom half circuit portion 304. The layout can be visualized as having 4 major vertical diffusions columns going from left to right. As shown in FIG. 6, each diffusion column is housing a pair of transistors in each of the top (302) and bottom (304) half circuit portions. The top half circuit portion (302) will be described first and it will be seen that the bottom half circuit portion 304 is almost a mirror replica of the top half circuit portion 302. The first diffusion column is in active NMOS layer (480) and is associated with an access/driver transistor pair AN2/DN1, in the top circuit portion, and an access/driver transistor pair, AN3/DN4 in the bottom circuit portion.

Figure 9:
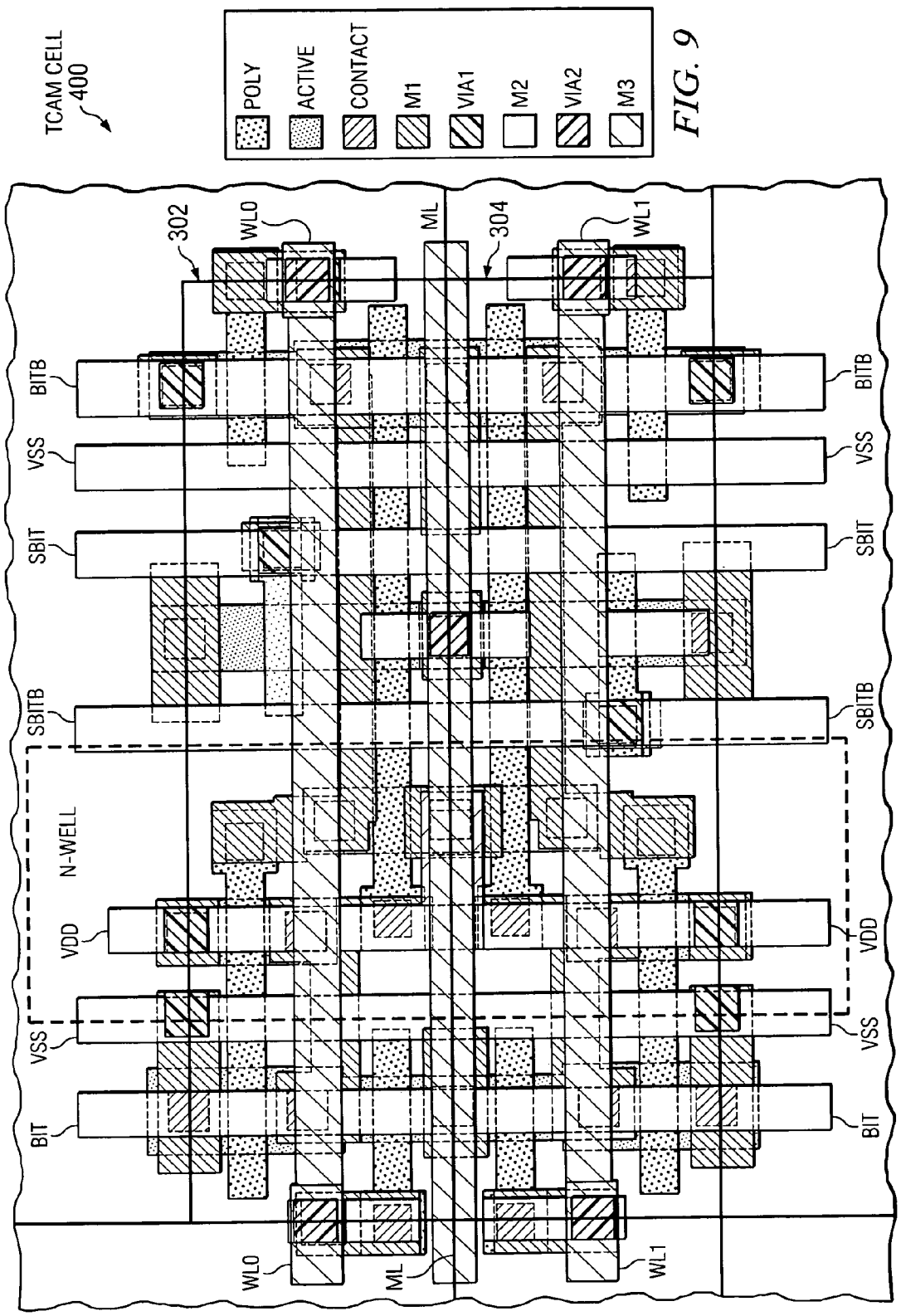

The drain terminal of each of the access transistors AN1 and AN3 is connected to the common bit line, and the source terminal of each of the access transistors AN1 and AN3 is shared by the drain terminal of DN2 and DN4 in the top and bottom half circuit portions respectively. The gates of the access transistors 416 and 470 respectively of AN1 and AN2 are connected to individual word lines WL0. Similarly the gates 416 and 470 of access transistors AN3, AN4 in the bottom half circuit portion 304 are connected to individual word lines WL1. FIG. 9 shows how horizontal metal 3 layer (M3) is used to connect the individual word lines WL0 on either ends of the TCAM cell 400. Similarly, FIG. 9 also shows metal 3 layer M3 connecting the WL1 word lines. As can be seen in FIG. 6, driver transistors DN2 and DN4 are at the periphery of the TCAM cell and have shared vias at the VSS terminal at the peripheral boundary of the TCAM cell 400, which is shared with another adjacent TCAM cell (not shown). As can be seen, the common BIT line of transistors AN1 and AN3 is shared at the centerline boundary of the two half cells.

The second vertical diffusion columns, going from left to right of the layout are housed in active PMOS layer 482 in an N-well substrate. Load PMOS transistors LP1, LP2, are associated with the top circuit 302, whereas load PMOS transistors LP3, LP4 are associated with the bottom portion 304. As can be seen in FIG. 6, the common POLY can be seen at the shared gate of LP2 and DN2. Similarly, DN4, LP4 have a shared gate as shown by the common POLY. The source terminals of LP2 and LP4 are connected separately to VDD terminals which are connected at the periphery of the TCAM cell 400, and will have shared vias with an adjacently placed TCAM cell (not shown). It can be seen that the source terminals of LP1 and LP3 share a common terminal VDD at the centerline boundary of the half cell. It can be seen that the gate terminal of transistors LP1, CN1 and DN1 are shared by a long POLY connection in the top half circuit portion 302. Similarly, transistors LP3, CN3, DN3 share a long POLY connection in the bottom half circuit portion 304 of the TCAM cell 400.

It must be noted that the poly is not bent as in a TCAM cell where the memory elements and their associated compare circuitry are placed side by side. In case of non-stacked TCAM cells, the match line is different for different cells and thus cannot be shared with adjacent TCAM cells. Therefore, the spacing must be maintained between two match line contacts resulting in a bent poly connection. In a stacked TCAM cell match line is shared between two memory elements which does not require bent poly connection due to spacing and results in reduced metal line length.

The third vertical diffusion column houses NMOS based compare transistors CN2, CN1 in the top half circuit portion 302, and CN3, CN4 in the bottom half circuit portion 304 of the TCAM cell 400. The source terminals 430 of compare transistors CN1 and CN3 are connected at the stacked centerline boundary of the half cells as shown by the match line ML connection. The source terminals of the compare transistors are connected to separate VSS terminals which are placed at the top and bottom periphery of the associated compare transistor. These peripheral boundary connections are shared with adjacent TCAM cells (not shown). The gate of each of the compare transistors CN2, CN4 is respectively connected to the search bit SBIT and search bit complement SBITB line. The compare transistors are deposited in active NMOS layer 480.

The fourth and last diffusion column is in active NMOS layer 480 hosting transistor pair AN2, DN1 in the top half circuit portion 302, and transistor pair DN3, AN4 in the bottom half circuit portion 304 of the TCAM cell 400. Word lines WL0 are connected to the gate terminals of AN1 and AN2 in the top half circuit portion 302, and word lines WL1 are connected to the gate terminals of AN3 and AN4 in the bottom half circuit portion 304 of the TCAM cell 400. As will be seen horizontal running metal 3 layer (FIG. 9) will be used for word line interconnectivity. The drain terminals of AN2 and AN4 are separately connected to the read/write complement bit line BITB which is shown as a shared contact at the periphery of the TCAM cell 400, shared by an adjacent TCAM cell.

As can be readily seen, the periphery of the TCAM cell 400 facilitates sharing of interconnections with the adjacent TCAM cells on all 4 sides (not shown). It can also be seen that the stacked centerline boundary shared by each of the half cell also shares interconnections between the half circuit portions and thereby provides silicon area savings and reduction of metal lines.

Now referring to FIG. 7, there is illustrated an embodiment of a TCAM cell 400, showing metal 1 interconnectivity along with the different active, poly layers of FIG. 6. All transistors names and connectivity appearing in FIG. 6 are applicable here, and are shown. In addition, FIG. 7 depicts the transistor terminal names for each of the 16 transistors. FIG. 7 viewed along with FIGS. 5A, and 5B will provide all the connectivity detail necessary to understand the interconnectivity of the invention as described in these embodiments.

Now coming to the interconnectivity of the different transistors, we will address the interconnectivity of the top half circuit portion 302 first, and as will be seen, the bottom half circuit portion 304 is almost a replica of the top half circuit portion 302 except for the search bit complement SBITB poly connection. In an embodiment shown, horizontally running metal 1 layer (M1) is used for interconnectivity of the various terminals, of shared contacts, of common gates, etc. All source, drain and gate terminals of each of the transistors as appearing in FIGS. 5A and 5B are shown here. As can be seen, gate terminals 416 and 470 respectively of access transistors AN1 and AN2 of the top half circuit portion 302 are connected to word lines WL0. Similarly, gate terminals 416 and 470 respectively of access transistors AN3 and AN4 of the bottom half circuit portion 304 is similarly connected to word lines WL1. The drain terminals 425 of the top and bottom transistors AN1, AN3 are connected to the common BIT line shared at the centerline boundary of the two half cells. The drain terminals 455 of AN2, and AN4 are connected to the BITB terminal at the right top and bottom periphery of the TCAM cell. Common source terminal 430 of compare transistors CN1 and CN3 is connected to a commonly shared match line ML which divides the TCAM cell 400 into its two half circuit portions 302 and 304. Common gate terminal 450 of first compare transistor CN1 connects to each of the gates of LP1 and DN1 at the top and bottom half circuit portions. Similarly, common gate terminal 450 of first compare transistor CN3 of the bottom half circuit portion 304 connects to each of the gates of LP3 and DN3. Common gate terminal 492 connects to DN2, LP2 in the top half circuit portion 302, and common gate terminal 492 connects to DN4, LP4 in the bottom half circuit portion 304. Source terminals for VSS appear at the periphery and are connected to terminal 465 of each of the driver NMOS transistors DN2, DN4 at the top and bottom portions of the TCAM cell 400. Source terminals for VDD appear at the periphery and are connected to terminal 442 of each of the load PMOS transistors LP1 and LP3. Source terminal 435 of compare transistors CN2 and CN4 are connected to the VSS contacts at the top and bottom periphery of the TCAM cell 400. The gate terminal 440 of each of the compare transistors CN2 and CN4 in the top and bottom half portion is respectively connected to the search bit SBIT and search bit complement line SBITB.

Transistors CN1 and CN3 are placed such that they facilitate sharing of a common match line ML between the top 302 and bottom 304 half circuit portion by connecting to the drain terminal 430 of each of the compare transistors. As can be seen, BIT, VSS, VDD and the ML contacts are shared at the centerline boundary of the two half cells. FIG. 7 also depicts the use of metal 1 layer M1 for the short interconnectivity between terminals 446 and 447 to 450. Metal 1 layer M1 is also used for interconnectivity of terminals 450 to common terminal 417/460.

As can be seen above, the invention as described in the above figures provides for a compact arrangement of transistors and efficient layout to facilitate shared interconnectivity to adjacent transistors within a TCAM cell and to adjacent TCAM cells. The placement of transistors provides for shorter match lines, and shorter interconnections.

Figure 8:
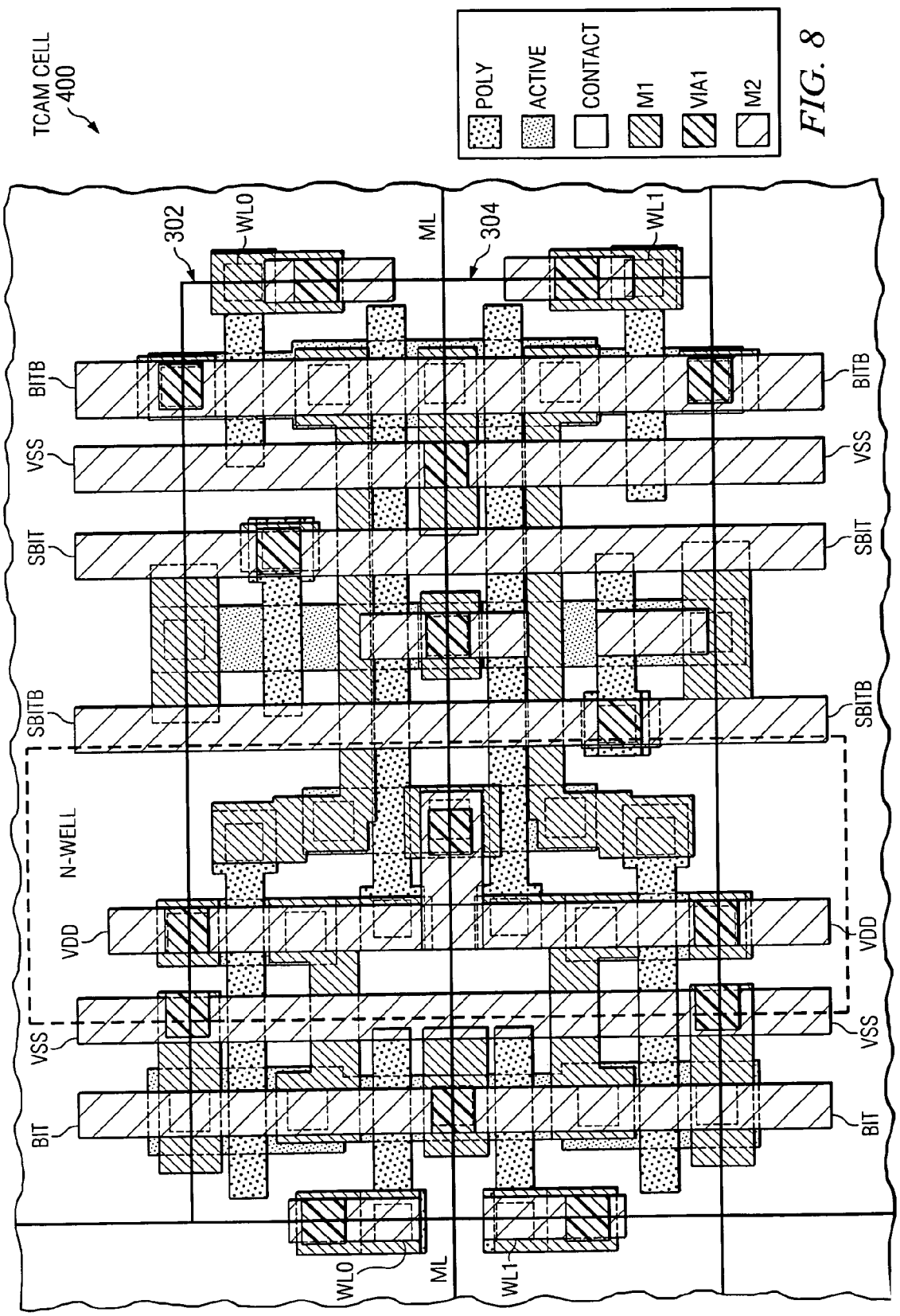

Now referring to FIG. 8, there is illustrated a TCAM cell 400 as shown in FIG. 8. As shown, there is depicted a metal 2 layer (M2) in addition to the active, poly, contact and, metal 1 layer (M1) as shown in FIGS. 6 and 7. It will be understood that all transistor names and terminal connection placements and inter-connectivity are the same as shown in FIGS. 6 and 7. For clarity, only the active PMOS layer 482, active NMOS layer 480, metal 1 layer M1, metal 2 layer M2, signals VSS and VDD, bit line BIT, bit complement line BITB, search bit SBIT, match line ML and word line WL are shown. Metal 2 layer (M2) is a vertically running metal layer that runs across the entire TCAM cell 400 as well as through the adjacent TCAM cells in a column. In effect, the BIT lines of all TCAM cells in a column share the common read/write BIT line. The access NMOS transistors AN1 and AN2 are positioned such that they share a common bit line BIT which runs vertically across the boundaries of the TCAM cell to connect to adjacent TCAM cells (as shown in FIGS. 2 and 4). It can be seen that vertically running metal 2 layer M2 is used for interconnectivity of BIT, VSS, VDD, SBITB, VSS, and BITB contacts and runs vertically across the TCAM cell 400. As can be seen from FIG. 8, VIA1 contacts are used when horizontal metal layer 1 M1 and vertical metal 2 layer M2 cross over each other.

Now referring to FIG. 9 there is depicted metal 3 layer (M3) in addition to the active, poly layer POLY, contact, metal 1 layer M1, VIA 1, metal 2 layer M2, VIA 2, and metal 3 layer (M3) as shown in FIGS. 6 and 7. As shown, metal 3 layer M3 is a horizontal running metal layer, used for word lines WL0, WL1 and for match line ML. In one embodiment, metal 2 layer M2 can be used for match line ML and word lines WL0 and WL1. In another embodiment, metal 3 layer (M3) can be used for the BIT, BITB, SBIT, SBITB, VSS and VDD terminals.

Although FIGS. 4-9 are illustrative of only one embodiment, it can be envisioned that metal 2 layer and metal 3 layers can be interchanged in other embodiments and that the metal layers can be additional and different. As can be seen the above described methods provide compact and efficient layout for providing shorter match lines which gives area advantages. Further, bit lines are shared providing an area reduction of height, by using 1.5 times the area required for 2 half cells, thereby giving a 25% reduction in height. The placement of match line ML also determines the poly placement such that it is not bent like a U and has space and capacitance advantages. The capacitance effects are reduced due to these features which provides fully parallel search with speed advantage. The above described method also provides application specific uses in routers and networking products.

The above-described methods and apparatus provide various schemes to enhance the performance and reduce the silicon area in TCAM cells. The inventive features of horizontal poly and vertical active layers in the above-described methods and apparatus can also be implemented for binary CAM cells. While the present subject matter has been described with reference to static memory elements, it is can be used in dynamic TCAM cells also.

The proposed technique increases performance and reduces silicon area and power consumption in a TCAM cell while controlling leakage effects.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

The invention is an efficient architecture of a TCAM cell using a novel way of transistor placements and interconnections with effective routing so that there is area reduction and performance and aspect ratio improvement. The invention also resides in a novel way of circuit layout arrangement of a pair of memory elements interconnected to a pair of associated compare circuits such that the transistors are stacked in a vertical arrangement so as to allow more room to fit more cells thereby providing a compact design. The invention also uses fewer metal lines, shorter interconnections, and shared match lines between the two half circuits thereby providing a shared, halved match line at the dividing boundary of two half cells within a TCAM cell.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements.

FIGS. 1-9 are merely representational and are not drawn to scale. Certain proportions thereof may be exaggerated, while others may be minimized. FIGS. 1-8 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A TCAM cell architecture comprising:
   a pair of memory elements connected to an associated read/write bit line and a read/write bit complement line for storing a data bit and a complement data bit; and
   a pair of compare circuits connected to an associated search bit line and a search bit complement line, and connected to the associated pair of memory elements that compares the stored data bit with a received compare data bit and drives a mismatch signal onto an associated match line ML when the stored data bit is not equal to the compare data bit,
   wherein each of the pair of memory elements are connected using substantially vertical interconnections that are disposed in active NMOS layers and active PMOS layers and further connected using substantially horizontal interconnections that are disposed in selective metal layers,
   wherein the pair of memory elements and the associated read/write bit line and the read/write bit complement line are connected using substantially horizontal interconnections that are disposed in a poly layer and a metal layer;
   wherein each of the pair of memory elements are connected such that they are stacked vertically to provide a shared read/write bit line resulting in a reduced number of bit lines, reduced width of TCAM cell, reduction of silicon area, and improved performance, and
   wherein each of the pair of compare circuits includes a pair of compare NMOS transistors, and wherein each pair of NMOS compare transistors is connected using substantially vertical interconnections that are disposed in active NMOS layer.

2. The TCAM cell architecture of claim 1, wherein each of the pair of memory elements with its associated pair of access transistors, and associated compare circuit defines a half circuit portion of a TCAM cell, wherein each half circuit is stacked vertically next to each other providing a top half circuit portion and a bottom half circuit portion.

3. The TCAM cell architecture of claim 1, wherein each of the pair of compare circuits are connected such that each of the pair of compare transistors of each compare circuit is disposed substantially vertically so as to provide a shared match line ML at the stacked centerline boundary of the pair of memory elements resulting in a reduction of length of match line by half, reduced area, and improved performance.

4. The TCAM cell architecture of claim 1 wherein each of the pair of compare circuits are connected to its associated memory element and includes a pair of serially connected first and second NMOS transistors that compares the stored data bit with a received compare data bit and drives a mismatch signal onto the match line when the stored data bit is not equal to the compare data bit.

5. The TCAM cell architecture of claim 4 wherein the gate of the second compare transistor of the top half circuit portion is connected to a search bit line SBIT and the gate of the second compare transistor of the bottom half right circuit portion is connected to a search bit complement line SBITB, wherein the source terminal of the second compare transistor of each of the top and bottom half circuit portions is connected to a VSS terminal, wherein said VSS terminal is positioned at the bottom periphery of the full TCAM cell facilitating a shared via to another adjacent TCAM cell.

6. The TCAM cell architecture of claim 1 wherein each of the pair of memory elements is a 6T SRAM cell that includes a pair of first and second back to back inverters, and an associated pair of access transistors, wherein each of the first and second back to back inverters further includes a load PMOS transistor disposed substantially vertically in active PMOS layer deposited in a N-well, and a driver NMOS transistor, wherein each of the pair of access transistors includes a first and second NMOS access transistors associated with each of the pair of back to back inverters, wherein all of the NMOS transistors are disposed substantially vertically in active NMOS layer.

7. The TCAM cell architecture of claim 6 wherein each of the transistors associated with each of the memory elements and each of the compare circuits includes a source, a gate and a drain terminal, wherein each gate terminal of each transistor is disposed substantially horizontally in a poly layer POLY.

8. The TCAM cell architecture of claim 6 wherein the drain of the first access transistor of the top and bottom half circuit portions is connected to a shared bit line BIT, and the drain of the second access transistor of the top and bottom half circuit portions is connected to a shared bit complement line BITB, wherein said BITB is connected at the periphery of the TCAM cell so as to facilitate a shared via with another adjacent TCAM cell.

9. The TCAM cell architecture of claim 6 wherein the gates of the first pair of access transistors associated with the top half circuit portion are connected to a first word line WL0 and the gates of the second pair of access transistors associated with the bottom half circuit portion are connected to a second word line, wherein the first and second word lines are connected at the periphery of the TCAM cell to facilitate shared connections to adjacent word lines of adjacent TCAM cells.

10. The TCAM cell architecture of claim 1 wherein the TCAM cell resides on an ASIC device to facilitate search function in network communication devices.

11. A TCAM circuit, comprising:
a TCAM block array including (M×N) TCAM blocks arranged in M number of rows and N number of columns, wherein each TCAM block comprising:
(M×N) TCAM cells arranged in a rectangular array of M number of rows and N number of columns, wherein each TCAM cell comprising a top half circuit portion electrically interconnected to a replicated bottom half circuit portion, wherein a read/write bit line and its read/write bit complement line, a search bit line and its search bit complement line are connected between each TCAM cell in each TCAM block, wherein each TCAM cell comprising:
a pair of memory elements associated with each of the half circuit portions connected to an associated read/write bit line and read/write bit complement line for storing a data bit and a complement data bit; and
a pair of compare circuits associated with each of the pair of memory elements connected to an associated search bit line and a search bit complement line for comparing a stored data bit with a received compare data bit and inputting a mismatch signal onto an associated shared match line ML when the stored data bit is not equal to the compare data bit,
wherein each of the pair of memory elements are connected using substantially vertical interconnections disposed in active NMOS layer and active PMOS layer and further connected using substantially horizontal interconnections that are disposed in selective metal layers,
wherein the pair of memory elements and the associated read/write bit line and the read/write bit complement line are connected using substantially horizontal interconnections that are disposed in a poly layer and selective metal layers,
wherein each of the pair of memory elements are connected such that each of the pair of storage elements are stacked vertically so as to provide a shared bit line, a reduced number of bit lines, reduction of silicon area, and improved performance,
wherein each of the pair of compare circuits includes a pair of NMOS transistors which are connected using substantially vertical interconnections that are disposed in active NMOS layer.

12. The TCAM circuit as in claim 11, wherein each of the pair of compare circuits are connected such that each of the pair of compare transistors of each compare circuit is disposed substantially vertically so as to provide a shared match line at the stacked centerline boundary of the pair of memory elements resulting in a reduction of match line length by half, reduced area, and improved performance.

13. The TCAM circuit as in claim 11 wherein each of the pair of compare circuits are connected to its associated memory element and includes a pair of serially connected first and second NMOS compare transistors that compare the stored data bit with a received compare data bit and drives a mismatch signal onto the shared match line ML when the stored data bit is not equal to the compare data bit.

14. The TCAM circuit as in claim 13 wherein the gate of the second compare transistor of the top half circuit portion is connected to a search bit line BIT and the gate of the second compare transistor of the bottom half right circuit portion is connected to a search bit complement line SBITB, wherein the source terminal of the second compare transistor of each of the top and bottom half circuit portions is connected to a VSS terminal, wherein said VSS terminal is positioned at the bottom periphery of the full TCAM cell facilitating a shared via to another adjacent TCAM cell.

15. The TCAM circuit as in claim 11 wherein each of the pair of memory elements is a 6T SRAM cell that includes a pair of first and second back to back inverters, and an associated pair of access transistors, wherein each of the first and second back to back inverters further includes a first load PMOS transistor disposed substantially vertically in active PMOS layer deposited in a N-well, and a first driver NMOS transistor, wherein each of the pair of access transistors includes a first and second NMOS access transistors associated with each of the pair of back to back inverters, wherein all of the NMOS transistors are disposed substantially vertically in active NMOS layer.

16. The TCAM circuit of claim 15 wherein each of the transistors associated with each of the memory elements and each of the compare circuits includes a source, a gate and a drain terminal, wherein each gate terminal of each transistor is disposed substantially horizontally in a poly layer POLY,
wherein the gates of the first and second NMOS access transistors of the top half circuit portion are connected to a first word line, and the gates of the first and second NMOS access transistors of the bottom half circuit portion are connected to a second word line;
wherein the drain terminal of the first access NMOS transistor of the top and bottom half circuit portion is connected to a shared bit complement line BITB;
wherein the gate terminal of each of the first load PMOS transistor, first compare NMOS transistor, and first driver NMOS transistor of the top half circuit portion is connected to a common gate terminal;
wherein the gate terminal of each of the first load PMOS transistor, first compare NMOS transistor, and first driver NMOS transistor of the bottom half circuit portion is connected to a common gate terminal;
wherein the gate terminals of the second driver NMOS transistor and its associated second load PMOS transistor of the top half circuit portion shares a common gate terminal; and
wherein the gate terminals of the second driver NMOS transistor and its associated second load PMOS transistor of the bottom half circuit portion shares a common gate terminal.

17. The TCAM circuit of claim 16 wherein the drains of the first access transistor of the top and bottom half circuit portions are connected to a shared bit line BIT and, the drains of the second access transistors of the top and bottom half circuit portions is connected to a shared bit complement line BITB, wherein said BITB is connected at the periphery of the TCAM cell so as to facilitate a shared via with another adjacent TCAM cell.

18. The TCAM circuit of claim 16 wherein the gates of the first pair of access transistors is connected to a first word line and the gates of the second pair of access transistors is connected to a second word line.

19. The TCAM circuit of claim 16, wherein the source terminals of each of the load PMOS transistors are connected to a VDD terminal and the source terminals of each of the driver NMOS transistors are connected to a VSS terminal;
wherein the VSS, VDD terminals of the first driver NMOS transistor and first load PMOS transistor are at the match line boundary and are shared between each of the half circuit portions; and
wherein the VSS, VDD terminals of the second driver NMOS transistor and second load PMOS transistor are at the top and bottom periphery of the TCAM cell and are shared with the adjacent TCAM cells.

20. The TCAM circuit of claim 11, wherein the terminals VSS, VDD, VSS, SBIT, BITB of the top half circuit portion share contacts with an adjacent TCAM cell at the top periphery;
wherein the terminals VSS, VDD, SBITB, VSS, BITB of the bottom half circuit portion share contacts with an adjacent TCAM cell at the bottom periphery;
wherein the word lines WL0 and WL1 share contacts with an adjacent TCAM cell on the left and right boundaries of the TCAM cell; and
wherein the signals BIT, VDD, ML, VSS of the top half circuit portion share terminals with the corresponding signals of the bottom circuit portion, at the match line dividing line of the full TCAM cell providing a shared boundary between the two half team cells.

21. The TCAM circuit of claim 11 wherein the TCAM cell resides on an ASIC device to facilitate search function in network communication devices.

22. A method of connecting a TCAM cell, comprising:
providing a top half circuit portion comprising a first memory element and an associated first compare circuit;
providing a bottom half circuit portion comprising a second memory element and an associated second compare circuit;
disposing the first memory element and the second memory element in a vertical stacked arrangement;
disposing the first compare circuit and the second compare circuit in a vertical stacked arrangement such that they are adjacent and define the shared boundary of the top half circuit portion and the bottom half circuit portion;
connecting the first memory element and the second memory element so as to provide a shared read/write bit line; and
connecting the first compare circuit and the second compare circuits so as to provide a shared match line ML connecting the top half circuit portion and the bottom half circuit portion.

23. A method according to claim 22 wherein, in disposing the memory elements, the vertical stacked arrangement of the memory elements provides a shared bit line BIT, a shared bit complement line BITB, a reduced width of the TCAM cell, reduced silicon area and improved performance.

24. A method according to claim 22 wherein, in disposing the compare circuits, the vertical stacked arrangement of the compare circuits provides a match line length reduction by half, reduced silicon area and improved performance.

* * * * *